United States Patent [19]

Elliott et al.

[11] 3,921,888

[45] Nov. 25, 1975

[54] WAVE SOLDERING OF PRINTED CIRCUITS

[75] Inventors: Donald Allan Elliott, Brossard; Zoltan Palko, St. Lambert, both of Canada

[73] Assignee: Electrovert Inc., Canada

[22] Filed: Dec. 16, 1974

[21] Appl. No.: 533,199

[30] Foreign Application Priority Data

Oct. 7, 1974 Canada ................................ 210934

[52] U.S. Cl. .................... 228/180; 228/260; 228/37

[51] Int. Cl.$^2$ ........................................... H05K 3/34

[58] Field of Search ................ 29/471.1, 471.3, 503; 228/37

[56] References Cited

UNITED STATES PATENTS

| | | | |
|---|---|---|---|
| 2,993,272 | 7/1961 | Carlzen et al | 29/503 |
| 3,482,755 | 12/1969 | Raciti | 29/503 X |
| 3,553,824 | 1/1971 | Kozelnicky | 228/19 X |
| 3,713,876 | 1/1973 | Lavric | 29/503 X |

*Primary Examiner*—Al Lawrence Smith
*Assistant Examiner*—K. J. Ramsey
*Attorney, Agent, or Firm*—McGlew and Tuttle

[57] ABSTRACT

An apparatus applies solder to exposed and protruding metallic surfaces extending from one face of a printed circuit board being passed at a predetermined speed along a path having an upward slope. A solder reservoir has a discharge nozzle positioned thereabove to produce a solder wave, with the protruding pins or the like on each circuit board entering one side of this wave and exiting from the other side. The wave is so guided that a major volumetric portion thereof flows downwardly on the entry side of the wave and the remaining volumetric portion is guided to flow from the exit side of the wave along a tray leading to an adjustable weir. The solder flows along this tray either horizontally or downwardly, as a smooth stream of solder in substantially the same direction and at substantially the same speed as that of the circuit boards moving along the path. The circuit boards are withdrawn from the smooth stream of solder with a relative movement, between the protruding portions of the circuit boards and the smooth stream of solder, which is substantially only vertical so that "side icicles" of solder are avoided.

18 Claims, 4 Drawing Figures

WAVE SOLDERING OF PRINTED CIRCUITS

FIELD AND BACKGROUND OF THE INVENTION

This invention relates generally to soldering and, more particularly, to a method and apparatus for applying solder to one surface of the printed circuit board or the like having component leads or protruding pins extending from the surface, in a single pass.

Conventional printed circuit boards contain electronic components with clinched or straight-through leads usually extending a maximum length of 0.090 inches (2.2 mm) from one side. In modern production technology, soldering of these printed circuit boards generally is carried out using a wave soldering apparatus and passing a circuit board through a device applying a uniform coating of flux to the lower surface of the board including component leads and pins. Under the influence of capillary action, the flux passes upwardly through holes in the board through which the pins protrude. The volatile components of the liquid flux evaporate and the circuit board is generally preheated before entering a solder wave.

In modern electronic technology, printed circuit board assemblies are characterized by high density packaging of components and by fine circuit lines. These complex, multi-layer boards can have long pins ranging up to three quarters of an inch (20 mm), and sometimes longer, protruding from one surface, and these pins must be soldered to a circuit board. The pins are used to accommodate presently available wire wrapping connecting devices to form connections at each pin. The term "long pins" includes long protruding leads extending from components mounted on a circuit board.

The use of long pins in a circuit board causes a number of problems in the wave soldering step. Because is the length or height of the pins, a high wave of solder is necessary and this requires a high solder mass flow and, consequently, higher flow speeds. Furthermore, the speed of the circuit boards passing through this high wave has generally been of the order of 1–1.5 feet per minute. When the pins pass through the solder wave, the tips of the pins often have solder left on them, and this solidifies and forms what are referred to as icicles. If the icicles are vertical, that is to say, the icicles extend vertically downwardly, they do not interfere with the wire wrapping connecting devices. However, due to the high flow of speed of the solder passing over the pins, the icicles formed at the tips often extend sideways or laterally. These tip icicles, hereinafter referred to as "side icicles," extend outside the circumference or perimeter of the pin and thus prevent the wire wrapping connecting device from being used. In some cases, side icicles extend across two or more pins to bridge the same and cause a short in the circuit board. To remove the side icicles requires an additional operation which adds to the cost of producing the circuit board assembly.

Attempts have been made to overcome the problem of side icicles, forming on the tips of the pins, by dipping the protruding pins of the circuit board into a reservoir of molten solder and lifting the circuit board vertically out of the solder so that there is no sideways movement between the solder and the pins and, consequently, any icicles that form are vertical icicles. However, the solder dip or drag methods, some of which are conveyorized, cause other problems, one of which is that too much heat occurs on the underside of the circuit board and tends to damage the components and distort the boards. Another difficulty is the extremely fine control of fluxing required in this operation to prevent the solder from spitting resulting in solder balls settling on top of the board. If the solder spitting can be overcome, then the solder resist coating generally applied to the top of the board may be eliminated. A still further problem with this method is the inability to maintain the temperatures of the solder constant throughout the surface layer of the reservoir, which results in a longer time for the method to be completed.

Another problem that occurs with the stationary reservoir of solder is due to the dross or oxide which forms on the surface of the solder in contact with the air. This dross must be manually removed or automatically skimmed from the static surface before soldering the assembly.

For the above reasons, it is preferred to use a wave soldering technique for long pins extending from the circuit board, as the wave soldering technique permits a wider latitude in the control of the fluxing and provides solder at a constant temperature, substantially dross-free, to the undersurface of the circuit board in a wave which heats only a portion of the board at a time.

Apart from the problem of side icicle formation on the tips of the pins, other criteria must be taken into consideration. For instance, if the solder wave has a high flow speed, it tends to wash off some of the flux already dried on the pins, and this can result in dross or solder oxide being deposited on the surfaces of the pins. Consequently, this prevents the wire wrapping device from moving freely up the pin or, alternatively, a poor connection occurs after a wire wrapping operation has taken place. Furthermore, if an additional operation is required to remove side icicles from the tips of the pins, the operation generally is carried out by a solder wave extender or a second solder wave which can leave dross formed on the surface of the pin and again a poor connection occurs after the wire wrapping operation.

Other efforts have been made to overcome the problem of wave soldering printed circuit boards having long protruding pins. One method includes a conveyor inclined at an angle and utilizes an oil intermix system. This has the hazardous disadvantage of ejecting oil droplets vertically upwardly from the upper surface of the solder wave, and allows oil to settle inside the connectors and on the top surface of the circuit boards. As a result, oil is trapped in the solder joint between the protruding pin and the metal surfaces of the board, causing reduced strength of the solder joint. Consequently, a cleaning step is required to remove oil from the contact surfaces, and this constitutes another production operation step.

Other methods may be employed to solder coat the long pins and form soldered connections between the pins and the circuit boards. One such method employs, as a first step, coating the long pins with a solder resist, after which the board is passed through a solder wave and the solder resist is removed by a chemical process. This method requires additional steps, which makes it uneconomical.

SUMMARY OF THE INVENTION

The method embodying the invention applies solder to one face of a circuit board or the like having protruding pins extending therefrom by passing a circuit board at a predetermined speed along a path having an upward slope, forming an upwardly flowing solder wave beneath the path such that the face of the circuit board, having protruding pins, enters one side of the wave and exits on the other side of the wave, during a major volumetric portion of the solder wave, guiding the remaining volumetric portion of the solder wave to flow from the exit side of the wave as a smooth, horizontal or downwardly sloping stream of solder in substantially the same direction and at substantially the same speed as that of the circuit board moving along the path, and withdrawing the circuit board from such smooth stream of solder with a relative movement, between the protruding pins of the circuit board and the smooth stream of solder, which is substantially only vertical.

The apparatus embodying the invention comprises a reservoir adapted to contain solder at a predetermined level, a discharge nozzle facing upwardly positioned above the solder level in the reservoir and having a circuit board entry side and a circuit board exit side, and means for causing solder to flow upwardly through the nozzle to form a solder wave contacting the lower face of the circuit board and having a height greater than the height or length of any protruding metallic surfaces. The apparatus further includes an upwardly sloping circuit board path above the reservoir, passing over the nozzle, and means for moving a circuit board upwardly along the path at a predetermined speed from the entry side to the exit side of the nozzle. Means are provided for directing a major volumetric portion of the solder wave to flow downwardly on the entry side thereof, the entry side of the nozzle having, for this purpose, a contoured downwardly sloping guide adapted to return the major portion of the solder to the reservoir in a smooth flow. The remainder of the volumetric portion of the solder wave is guided to flow from the exit side of the wave, by means of a substantially rectangular tray attached to the exit side of the nozzle and having an adjustable weir at an edge parallel to and spaced from the exit side of the nozzle. The shape of the tray, together with the weir, are adapted to reduce feedback of flow disturbances in the solder wave and to guide the minor volumetric portion of the solder wave to form a smooth, horizontal or downwardly sloping stream of molten solder flowing in substantially the same direction and at approximately the same speed as that of the circuit board moving along the path.

An object of the invention is to provide an improved method and apparatus for applying molten solder to exposed and protruding metallic surfaces on one surface of a circuit board.

Another object of the invention is to provide such a method and apparatus for obviating the formation of "side icicles" of solidified solder on component leads or pins protruding from a surface of a printed circuit board.

A further object of the invention is to provide such a method and apparatus in which such component leads or protruding pins are coated with solder in a single pass operation which completely coats the pins with smooth dross-free solder and avoids "side icicles."

Another object of the invention is to provide such a method and apparatus for solder joining protruding pins and the like to metallic elements on a printed circuit board.

For an understanding of the principles of the invention, reference is made to the following description of typical embodiments thereof as illustrated in the accompanying drawings.

DESCRIPTION OF THE PREFERRED EMBODIMENTS

Figure 1:
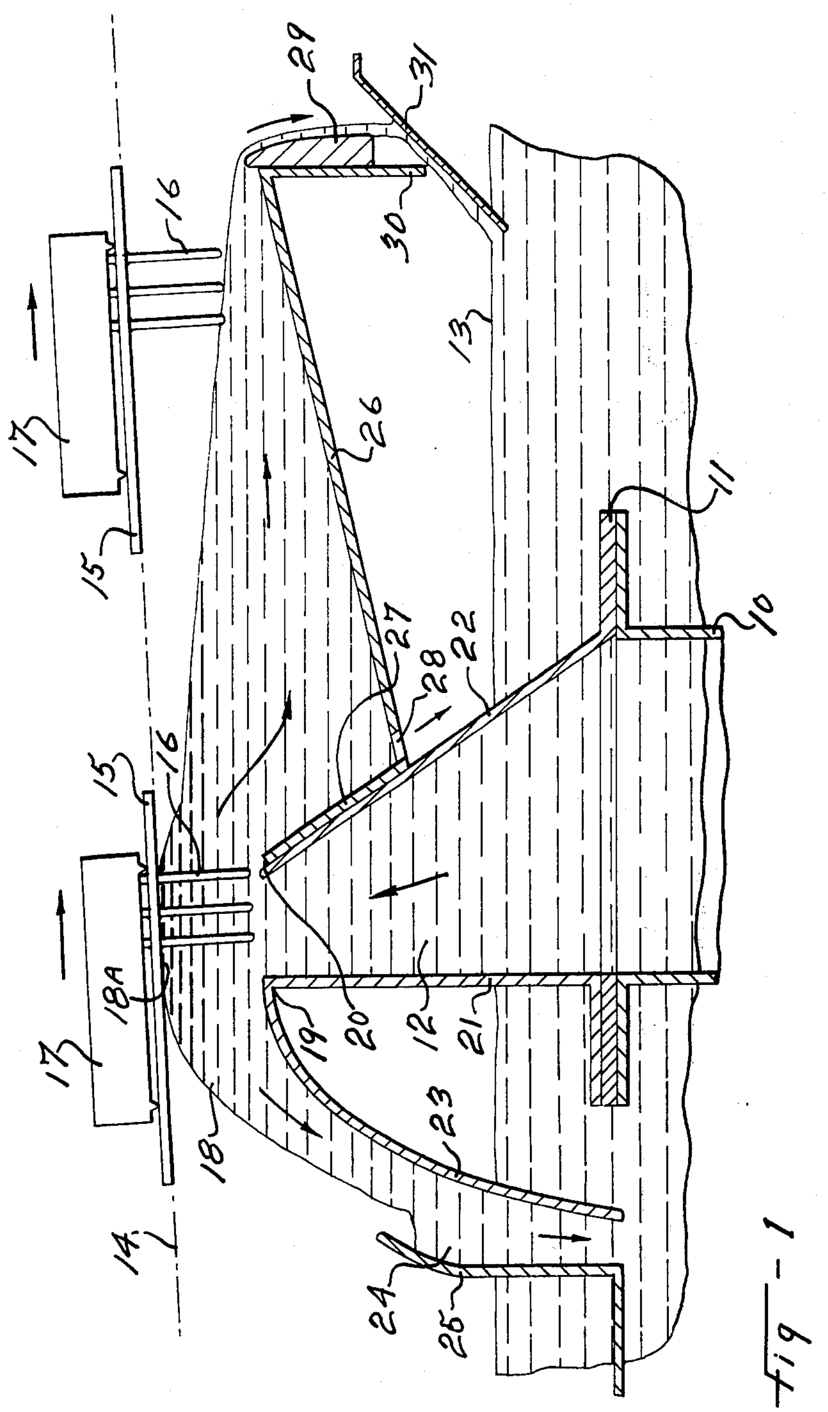
FIG. 1 is a longitudinal and vertical cross-sectional view illustrating one embodiment of the invention for applying a solder wave to the underside of a circuit board having elongated pins or the like protruding therefrom.

A cross-sectional view through a solder wave nozzle embodying the invention is shown in FIG. 1. This nozzle may be used with a number of well known types of wave soldering units, such as that shown and described in Tardoskegyi U.S. Pat. No. 3,198,414, issued Aug. 3, 1965. In the solder wave nozzle shown in FIG. 1, solder is pumped up through a conduit 10 which is connected by means of a flange 11 to a nozzle 12. The solder entering the nozzle 12 is at a preset temperature controlled within the unit. Such a wave soldering unit may have an automatic device to feed solder to the tank on a continuous basis, so as to maintain the level 13 of the solder at a substantially constant height in the reservoir having the conduit 10 communicating therewith, thus compensating for the solder which adheres to the pins and exposed surfaces of circuit boards passing through and above the solder wave.

The circuit boards are passed along a path 14, above the reservoir, and these circuit boards are indicated at 15 as having long pins 16 passing through them and joined to connector holders 17. Path 14 slopes upwardly at an angle not in excess of 10° to the horizontal, but preferably at an angle of 4° – 8°. Furthermore, the elevation of the path may be varied to insure that the tips of the pins 16 miss the top of the nozzle 12 by a small amount and, if the circuit board has shorter pins or no pins, then path 14 may be lowered and the flow of solder through nozzle 12 reduced. In this way, the crest 18 A of solder wave 18, which projects from nozzle 12 as a standing wave, may be adjusted so that it just contacts the undersurface of a circuit board 15. Alternatively, the elevation of circuit board 15 above nozzle 12 is adjusted so the lower surface depresses the crest 18 A of solder wave 18. Each circuit board 15 moves up path 14 and passes over nozzle 12 from the entry side 19 to the exit side 20. The entry side 19 of nozzle 12 has a vertical wall 21 and the exit side 20 has an inwardly sloping wall 22 designed so that the major volumetric portion of solder passing through nozzle 12 flows down on the entry side 19, with the remainder of the solder flowing over the exit side 20.

It will be noted that solder wave nozzle 12 extends above the level 13 of the solder in the reservoir. On the entry side 19 of nozzle 12, there is secured a specially designed contoured downwardly sloping guide 23 so formed that the solder, falling back into the reservoir, follows a streamlined path down guide 23 leaving no vacuum or air space between the path of the solder and the surface of guide 23 and preventing air from coming into contact with the undersurface of the solder, thereby to avoid dross forming thereon. The solder flows from entry side 19 of nozzle 12 and follows guide 23 into a solder receiving section 24 consisting of a passage between guide 23 and an adjustable guide 25. Adjustable guide 25 may be moved backwards and forwards to vary the size of passage 24. The solder flows into passage 24 at a speed lower than it would have if it were falling directly into the reservoir, and thus avoids any turbulence occurring in the solder stream. The lower end of passge 24 opens directly into the reservoir below the solder surface level 13.

The remaning volumetric portion of solder wave 18 flows over the exit side 20 of nozzle 12 in the direction of movement of circuit boards 15 along path 14. A tray 26, which is substantially rectangular in shape, has one end 27 extending at an angle greater than 90 degrees relative to its base. End 27 is secured to the exterior of inwardly sloping wall 22 of nozzle 12. While the position of tray 26 relative to nozzle 12 is fixed, tray 26 may be removed for cleaning purposes. The tray is designed on the basis of practical experiments, and is shaped to reduce feedback of flow disturbances, such as oscillations and ripples on the surface of the solder wave. At least one drain hole 28 is positioned in the corner of tray 26 adjacent side 27, and prevents solder remaining in tray 26 when the solder wave is turned off or interrupted. At the other end of tray 26, an adjustable weir plate 29 is attached to an extended edge 30 of tray 26, which edge 30 projects vertically downwardly.

Weir plate 29, shown in this embodiment of the invention, may be adjusted vertically up or down relative to extended edge 30 of tray 26. Weir plate 29 furthermore is contoured to provide a streamlined flow for solder flowing over it, and a deflector plate 31 guides the solder to the reservoir without the occurrence of any splashing.

Figure 2:
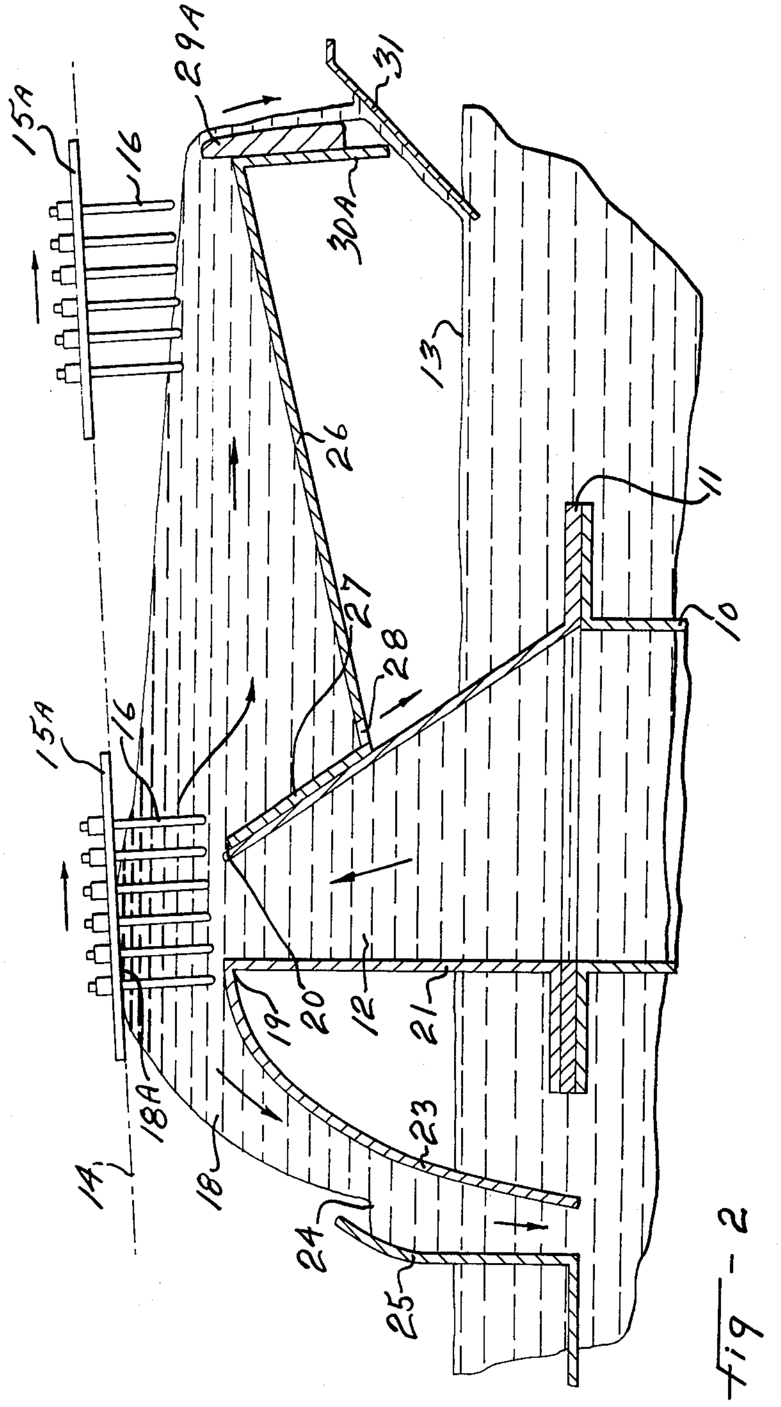
FIG. 2 is a view, similar to FIG. 1, illustrating a second embodiment of the invention.

The solder wave nozzle shown in FIG. 2 is substantially the same as that shown in FIG. 1, with the exception that the extended edge 30A of tray 26 projects downwardly at an angle of up to 15° to the vertical in a direction away from solder wave 18. In the particular embodiment illustrated, the angle is approximately 7°. Adjustable weir plate 29A rests on extended end 30A and is contoured for streamlined solder flow. Circuit boards 15A, shown passing along path 14, have pins 16 swaged through holes provided in the board, and capillary action forces solder to rise between each pin and the periphery of its hole to form a soldered joint.

Figure 3:
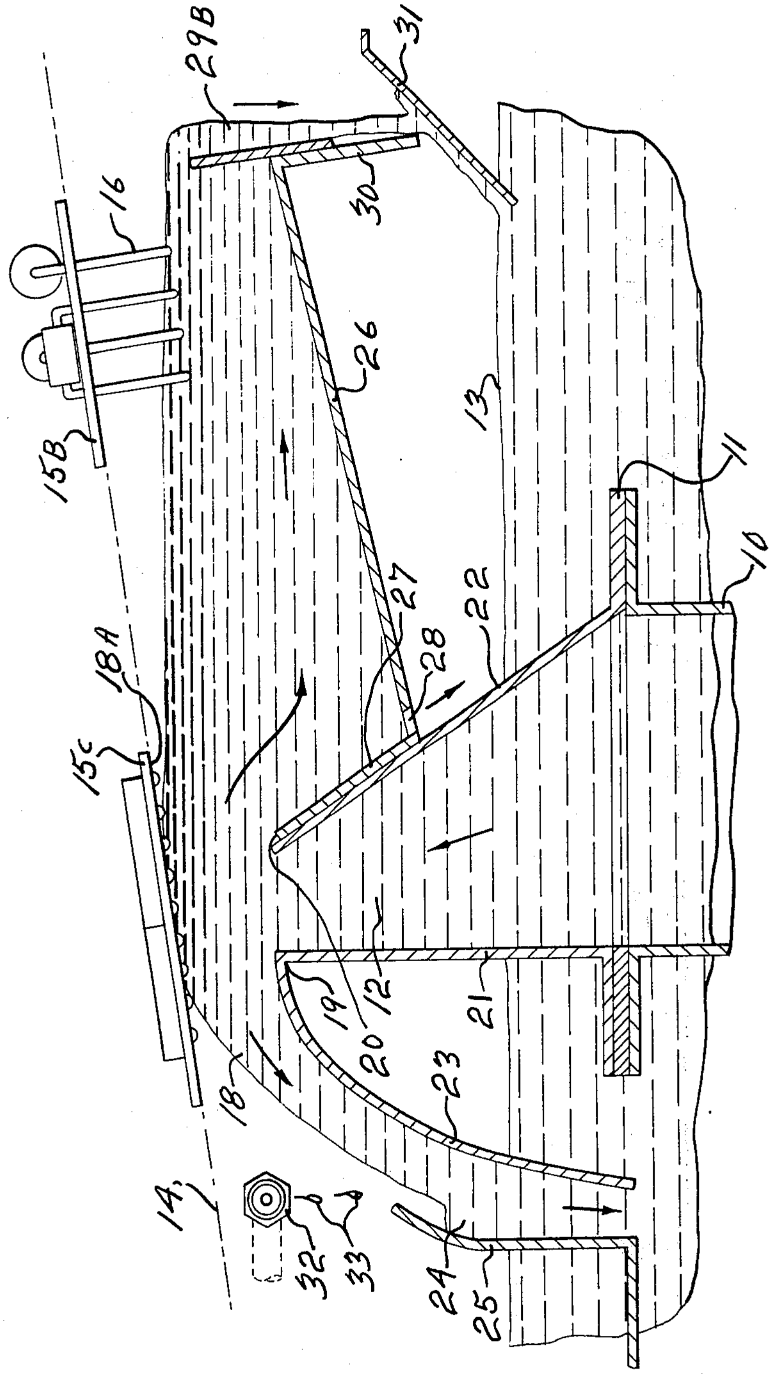
FIG. 3 is a view, similar to FIG. 1, of a third embodiment of the invention.

The solder wave nozzle shown in FIG. 3 also is the same essentially as that shown in FIG. 1, but has a flat, non-contoured weir plate 29B raised to the point where the level of the solder stream remains at substantially the same height as the crest 18A of solder wave 18. Different types of circuit boards are also shown in FIG. 3. Thus, circuit board 15B has long protruding leads 16 from components mounted on board 15B, and circuit board 15C has no pins but has exposed metallic surfaces on the underside of the board and which are to be solder coated and solder joined.

In a preferred embodiment, oil or other additives may be added to the solder in the reservoir to minimize formation of dross on exposed metallic surfaces. One method of applying oil to the solder is that shown and described in Tardoskegyi U.S. Pat. No. 3,386,166, issued June 4, 1968. In FIG. 3, an oil nozzle 32 is shown at one side of the reservoir and so positioned that oil drops 33 fall into passage 24 between sloping guide 23 and adjustable guide 25. The oil spreads along the raised surface of the solder in passage 24. In the case of small reservoirs, only one nozzle 32 is required. In large reservoirs, two nozzles, one adjacent each opposite side, are required. The flow of oil may be controlled as desired, and the type of oil or additive is known to those skilled in the art of wave soldering.

Figure 4:
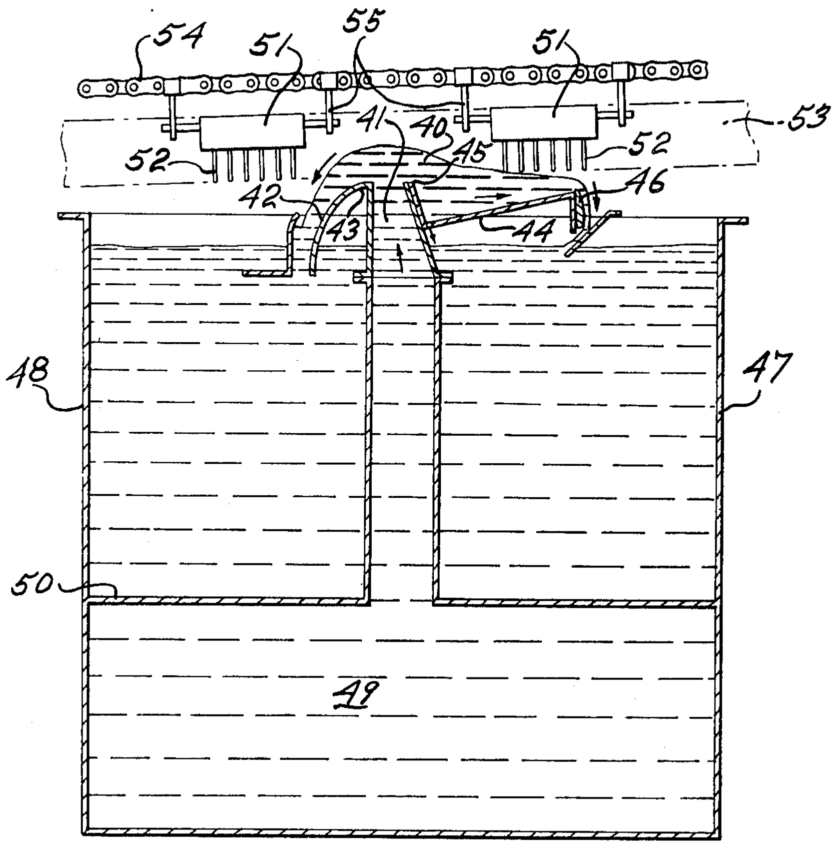
FIG. 4 is a view, similar to FIGS. 1, 2, and 3, through a solder wave unit including the solder reservoir and a circuit board conveyor.

FIG. 4 shows a solder wave unit with a standing solder wave 40 provided by solder flowing upwardly through a nozzle 41 having a downwardly sloping guide 42 extending from its entrance side 43 and a tray 44, of the type shown in FIGS. 1, 2 and 3, extending from its exit side 45, with solder flowing over a weir 46 into a reservoir 47. Reservoir 47 has an upper portion 48 divided from a lower portion 49 by a partition 50 through which solder flows upwardly into the nozzle 41. A pump and heater, which are known to those skilled in the art and consequently have not been shown, assure a flow of solder at a constant temperature upwardly through nozzle 41 to form the solder wave 40. Connectors 51 with long pins 52 or components, such as transistors, with component leads to be solder coated, pass along a path 53 conveyed by a chain 54 having clamps 55 to support the elements at desired intervals. In some cases, the circuit boards may be mounted in frames. Another type of conveyor system is so illustrated in U.S. Pat. No. 3,386,166, mentioned above.

In the operation of the invention, solder is pumped up through the nozzle 12, shown in FIGS. 1, 2 or 3, to form solder wave 18, and the height of the standing wave may be varied by varying the flow rate of solder through nozzle 12. As a major portion of the solder flows down on the circuit path entry side of nozzle 12, the height of solder wave 18 can be up to 30 percent higher than the case wherein a solder wave flows down evenly on both sides of the nozzle. Thus, a higher wave is obtained with a smaller flow. The position of circuit board path 14 is adjusted so that the tips of the pins, or the lowest extremities of exposed metallic surfaces of each circuit board 15 to be coated, clear the top of nozzle 12 while crest 18A of solder wave 18 touches the undersurface of the circuit board. Thus, the solder coats all the pins and exposed metallic surfaces of the board and, in addition, due to capillary action, the solder fills the gaps between pins and the circuit board to form soldered joints.

The location of the tray 26 is such that the remainder of the solder wave, flowing over exit side 20 of nozzle 12, generally has a slight drop as shown in FIGS. 1 and 2, and then proceeds to flow in a horizontally or slightly downwardly sloping path toward weir 29. In FIG. 3, the solder wave flowing from the exit side of wave 18 does not drop, as in FIGS. 1 and 2, but remains substantially horizontal or has only a slight downward slope. Thus, the velocity of the solder stream flowing from crest 18A of wave 18 away from the exit side of the nozzle is substantially the same as the speed of the circuit board moving along the travel path, and there is substantially no relative horizontal movement between a printed circuit board and the solder as the printed circuit board leaves the solder stream. The solder stream flows along tray 26 and spills over weir 29, which may be adjusted for height to insure the tips of pin 16 on each circuit board moving at approximately the same speed as the solder. Pins 16 are withdrawn from the solder stream before it flows over weir 29, as clearly illustrated in the drawing figures.

In the embodiments shown in FIGS. 1, 2 and 3, the tips of pins 16 are retracted substantially vertically from the solder stream with little or no lateral movement between the solder and the pins. Thus, any icicles which may form on the pins tend to be vertical icicles, which do not affect the wire wrapping connections put on at a later time in the assembly of the circuit boards. Also, in the embodiments shown in FIG. 3, solder does not tend to bridge across two exposed metallic surfaces because there is little or no lateral movement between the board and the solder stream as they separate.

In one embodiment of the invention, shown in FIG. 2, circuit path 14 extends upwardly from the horizontal at an angle preferably in the range of from 4° – 8°, and solder flowing over exit side 20 of nozzle 12 is directed into tray 26 and flows in a substantially horizontal stream until it meets weir 29A which preferably has a downward slope of approximately 7° to the vertical, in a direction away from nozzle 12. In another embodiment of the present invention, the flow of solder in solder wave 18 divides so that approximately 90 percent of the solder volume flows down the entry side 19 of nozzle 12 into the reservoir through passage 24, and the remaining volumetric portion of the solder flows over the exit side, along tray 26, and flows over contoured weir 29 onto deflector plate 31 and into the reservoir.

With the present invention, it has been found that circuit boards having long pins extending therefrom may be passed along the conveyor path of a solder wave unit of the present invention at speeds up to 7 feet per minute. Higher speeds may be expected with improved types of conveyor systems.

While specific embodiments of the invention have been shown and described in detail to illustrate the application of the principles of the invention, it will be understood that the invention may be embodied otherwise without departing from such principles.

What is claimed is:

1. A method of applying solder to one face of a circuit board or the like having protruding pins extending therefrom, comprising the steps of passing a circuit board at a predetermined speed along a path having an upward slope and with the protruding pins extending downwardly; forming an upwardly flowing solder wave beneath such path so that the face of the circuit board, having pins protruding therefrom, enters an entry side of the solder wave and exits on an exit side of the solder wave; directing a major volumetric portion of the solder wave to flow downwardly on the entry side of the wave; guiding the remaining volumetric portion of the solder wave to flow from the exit side of the wave as a smooth stream of solder in substantially the same direction and at substantially the same speed as that of the circuit board moving along such path; and withdrawing the circuit board from such smooth stream of solder with a relative movement, between the protruding pins of the circuit board and the smooth stream of solder, which is substantially only vertical.

2. A method of applying solder, as claimed in claiam 1, wherein the remaining volumetric portion of the solder wave flows from the exit side of the wave as a smooth, horizontal stream of solder.

3. A method of applying solder, as claimed in claim 1, wherein the remaining volumetric portion of the solder wave flows from the exit side of the wave as a smooth, downwardly sloping stream of solder.

4. A method of applying solder, as claimed in claim 1, wherein the upper slope of the circuit board path is not more than 10°.

5. A method of applying solder, as claimed in claim 4, wherein the upward slope of the circuit board path is in the range of from 4° to 8°.

6. A method of applying solder, according to claim 1, wherein up to approximately 90 percent of the flow of solder in the solder wave is directed to flow downwardly on the entry side of the wave.

7. A method of applying solder, as claimed in claim 1, wherein the predetermined speed of a circuit board along the circuit board path is approximately 7 feet per minute.

8. Apparatus for applying solder to exposed metallic surfaces and protruding metallic surfaces on one face of the circuit board or the like comprising, in combination, a reservoir adapted to contain molten solder at a predetermined level; an upwardly facing discharge nozzle extending above the solder level in the reservoir and having a circuit board entry side and a circuit board exit side; an upwardly sloping circuit board path above the reservoir and passing over said nozzle; means, including said nozzle, forming a standing wave of molten solder operable to contact the lower face of a circuit board moving along said circuit board path and being higher than any protruding metallic surfaces of a circuit board moving along the circuit board path; means moving a circuit board upwardly along the circuit board path at a predetermined speed from the entry side to the exit side of said nozzle; means directing a major volumetric portion of the solder wave to flow downwardly at the entry side of said nozzle; and means guiding the remaining volumetric portion of the solder wave to flow from the exit side of said nozzle as a smooth stream of solder at substantially the same direction and at substantially the same speed as that of a circuit board moving along said circuit board path.

9. Apparatus for applying solder, as claimed in claim 8, including a contoured, downwardly sloping guide at the entry side of said nozzle adapted to return the solder to the reservoir in a smooth flow.

10. Apparatus for applying solder, as claimed in claim 9, including a substantially rectangular tray, attached to the exit side of said nozzle; and an adjustable weir at the end of said tray spaced from and parallel to the exit side of said nozzle; the shape of said tray together with said weir being adapted to reduce feedback of flow disturbances on the smooth stream of solder flowing along said tray and to guide such remaining volumetric portion of the solder wave to flow from the exit side of the wave as a smooth stream of solder in substantially the same direction and at substantially the same speed as that of the circuit board moving along said circuit board path.

11. Apparatus for applying solder, as claimed in claim 10, including a solder receiving section at the circuit board entry side of said nozzle and between the discharge end of said nozzle and the solder level of said reservoir; and adjustable guide means included in said solder receiving section for varying the cross-sectional area of said section between the adjustable guide means and said contoured and downwardly sloping guide.

12. Apparatus for applying solder, as claimed in claim 11, including at least one oil nozzle positioned on at least one side of said reservoir over said solder receiving section and adapted to feed oil and other additives to the surface of the solder in said solder-receiving section.

13. Apparatus for applying solder, as claimed in claim 10, in which said means for moving a circuit board upwardly along said circuit board path comprises a conveyor chain arrangement; said circuit board path sloping upwardly at an angle not greater than 10°.

14. Apparatus for applying solder, as claimed in claim 13, in which said circuit board path slopes upwardly at an angle in the range between 4° and 8°.

15. Apparatus for applying solder, as claimed in claim 10, in which said discharge nozzle has a vertical wall on its circuit board entry side and an inwardly sloping wall at its circuit board exit side.

16. Apparatus for applying solder, as claimed in claim 10, wherein said adjustable weir has an upward and inward slope toward said discharge nozzle of not greater than 15° to the vertical.

17. Apparatus for applying solder, as claimed in claim 10, including a deflector plate mounted beneath said adjustable weir and operable to guide solder to the reservoir.

18. Apparatus for applying solder, as claimed in claim 10, including at least one drain hole in said rectangular tray adjacent said nozzle.

* * * * *

UNITED STATES PATENT OFFICE

CERTIFICATE OF CORRECTION

Patent No. 3,921,888 Dated November 25, 1975

Inventor(s) Donald Allan Elliott et al.

It is certified that error appears in the above-identified patent and that said Letters Patent are hereby corrected as shown below:

On the Cover Sheet item [73] should read as follows:

-- Assignee: Electrovert Manufacturing Company, Limited, Montreal, Quebec, Canada --

Signed and Sealed this

*eighth* Day of *June 1976*

[SEAL]

*Attest:*

RUTH C. MASON
*Attesting Officer*

C. MARSHALL DANN
*Commissioner of Patents and Trademarks*

US003921888A

REEXAMINATION CERTIFICATE (1893rd)

United States Patent [19]

[11] B1 3,921,888

Elliott et al.

[45] Certificate Issued Jan. 12, 1993

[54] WAVE SOLDERING OF PRINTED CIRCUITS

[75] Inventors: Donald A. Elliott, Brossard; Zoltan Palko, St. Lambert, both of Canada

[73] Assignee: Electrovert Ltd.

Reexamination Reqs:st:
No. 90/002,023, May 9, 1990
No. 90/002,210, Nov. 27, 1990

Reexamination Certificate for:

| | |
|---|---|
| Patent No.: | **3,921,888** |
| Issued: | **Nov. 25, 1975** |
| Appl. No.: | **533,199** |
| Filed: | **Dec. 16, 1974** |

[30] Foreign Application Priority Data

Oct. 7, 1974 [CA] Canada ........................ 210934

[51] Int. Cl.[5] ........................ H05K 3/34

[52] U.S. Cl. ........................ 228/180.1; 228/260; 228/37

[58] Field of Search ........................ 228/37, 180.1, 260

[56] References Cited

U.S. PATENT DOCUMENTS

| | | | |
|---|---|---|---|
| 2,993,272 | 7/1961 | Carlzen et al. | 228/37 |
| 3,037,274 | 6/1962 | Hancock | 228/37 X |
| 3,039,185 | 6/1962 | Oates | 228/37 X |
| 3,092,059 | 6/1963 | Tesch | 228/37 |
| 3,216,642 | 11/1965 | DeVerter | 228/37 |
| 3,217,959 | 11/1965 | Di Renzo | 228/37 |
| 3,398,873 | 8/1968 | Wegener et al. | 228/37 |
| 3,482,755 | 12/1969 | Raciti | 228/37 |
| 3,553,824 | 1/1971 | Kozelnicky | 228/180.1 |
| 3,612,388 | 10/1971 | Wegener et al. | 228/37 X |
| 3,713,876 | 1/1973 | Lavric | 228/37 X |
| 3,726,465 | 4/1973 | Boynton et al. | 228/260 X |
| 3,989,180 | 11/1976 | Tardoskegyi | 228/180.1 |

FOREIGN PATENT DOCUMENTS

| | | | |
|---|---|---|---|
| 2127150 | 12/1972 | Fed. Rep. of Germany . | |
| 2255240 | 5/1973 | Fed. Rep. of Germany . | |
| 2455629 | 4/1976 | Fed. Rep. of Germany . | |
| 299313 | 6/1971 | U.S.S.R. | 228/36 |
| 712109 | 7/1954 | United Kingdom | 228/256 |

OTHER PUBLICATIONS

Gay "Test on a Wave Soldering Machine" *Proceedings of International Electronic Packaging and Production Conference* (INTERNEPCON); Nov. 1972, pp. 75–81.

Tamil "Wave Soldering Techniques and the Environment" Sep. 1973, Source Unknown.

*Electrovert Avertising Brochure* "Models 517 and 616 Inclinable Conveyor Wavesoldering Systems"; Dec., 1972 pp. 1-2 (Bulletin 69/70–01).

*Mark IV Wave Soldering Machine* Brochure of Technical Devices Company; pp. 1-6 "Notes on the Soldering of Printed Circuits" by Fry's Metal Foundries, London, England 1960.

Bud "Principles of Wave Soldering" *Automation* Nov. 1970, pp. 61-65.

Bud "Mass Production Techniques Using the Principle of Wave Soldering" *Welding Journal* Jul. 1973, pp. 431–439.

P. J. Bud et al., "Wave Soldering and In-Line Wave Cleaning" *Electronic Production Methods and Equipment,* May 1973.

Bud "The Impact of the Liquid Wave on Soldering Technology" *Proceedings: International Electronic Packaging and Production Conference* (INTERNEPCON) Nov. 1972, pp. 65–74.

*Primary Examiner*—Kenneth J. Ramsey

[57] ABSTRACT

An apparatus applies solder to exposed and protruding metallic surfaces extending from one face of a printed circuit board being passed at a predetermined speed along a path having an upward slope. A solder reservoir has a discharge nozzle positioned thereabove to produce a solder wave, with the protruding pins or the like on each circuit board entering one side of this wave and exiting from the other side. The wave is so guided that a major volumetric portion thereof flows downwardly on the entry side of the wave and the remaining volumetric portion is guided to flow from the exit side of the wave along a tray leading to an adjustable weir. The solder flows along this tray either horizontally or downwardly, as a smooth stream of solder in substantially the same direction and at substantially the same speed as that of the circuit boards moving along the path. The circuit boards are withdrawn from the smooth stream of solder with a relative movement, between the protruding portions of the circuit boards and the smooth stream of solder, which is substantially only vertical so that "side icicles" of solder are avoided.

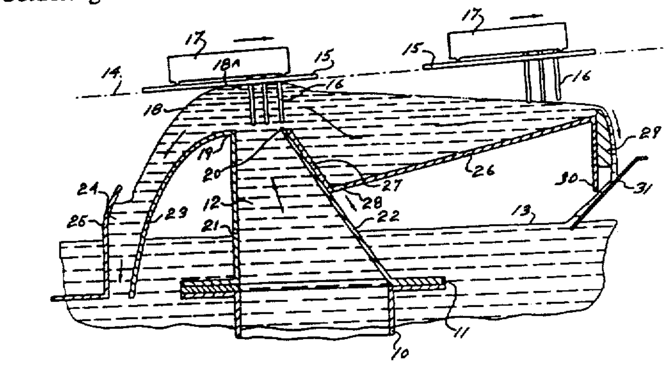

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-18 is confirmed.

New claim 19 is added and determined to be patentable.

*19. A method of applying solder to one face of circuit boards or the like having protruding pins of substantially different lengths extending therefrom, comprising the steps of passing said circuit boards at a predetermined speed along a path having an upward slope and with the protruding pins extending downwardly; forming an upwardly flowing solder wave beneath such path so that the face of the circuit boards, having pins protruding therefrom, enters an entry side of the solder wave and exits on an exit side of the solder wave; directing a major volumetric portion of the solder wave to flow downwardly on the entry side of the wave; guiding the remaining volumetric portion of the solder wave to flow from the exit side of the wave as a smooth stream of solder in substantially the same direction and at substantially the same speed as that of the circuit boards moving along such path; and withdrawing the circuit boards from such smooth stream of solder with a relative movement, between the protruding pins of the circuit boards and the smooth stream of solder, which is substantially only vertical.*

* * * * *